(12) United States Patent
Chow et al.

(10) Patent No.: US 7,462,077 B2
(45) Date of Patent: Dec. 9, 2008

(54) OVERMOLDED ELECTRONIC ASSEMBLY

(75) Inventors: Kin Yean Chow, Singapore (SG); Ching Meng Fang, Singapore (SG); Larry M. Mandel, Noblesville, IN (US); Sim Ying Yong, Singapore (SG)

(73) Assignee: Delphi Technologies, Inc., Troy, MI (US)

( * ) Notice: Subject to any disclaimer, the term of this patent is extended or adjusted under 35 U.S.C. 154(b) by 0 days.

(21) Appl. No.: 11/604,575

(22) Filed: Nov. 27, 2006

(65) Prior Publication Data

US 2008/0124987 A1    May 29, 2008

(51) Int. Cl.
*H01R 12/24* (2006.01)
(52) U.S. Cl. .................................. 439/736; 439/606

(58) Field of Classification Search ................. 439/736, 439/606, 604
See application file for complete search history.

(56) References Cited

U.S. PATENT DOCUMENTS

| 4,582,384 | A | * | 4/1986 | Frantz et al. ................. 439/610 |
| 5,733,145 | A | * | 3/1998 | Wood .......................... 439/604 |
| 6,910,914 | B1 | * | 6/2005 | Spink, Jr. ..................... 439/497 |
| 6,988,901 | B2 | * | 1/2006 | Ribeau et al. ................. 439/79 |

* cited by examiner

*Primary Examiner*—Gary F. Paumen
(74) *Attorney, Agent, or Firm*—Jimmy L. Funke

(57) ABSTRACT

A partially overmolded component having a precisely defined overmolding edge includes a component having a protruding elongate rib and the overmolding having a terminal edge abutting the protruding elongate rib. The rib defines surfaces that provide a greater area of contact between the component and an overmolding tool and a more tortuous flow path to bleed-through.

7 Claims, 1 Drawing Sheet

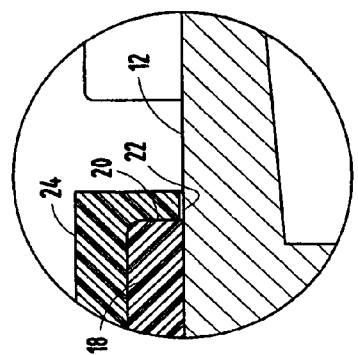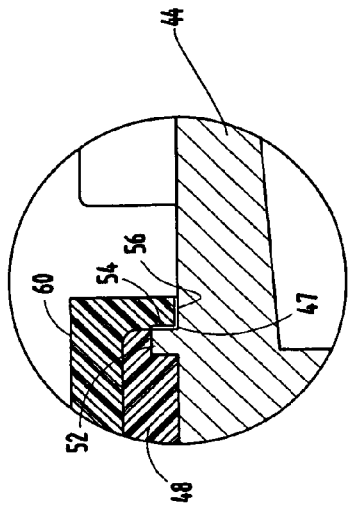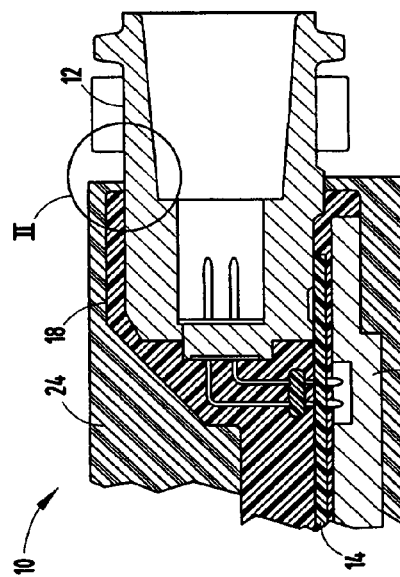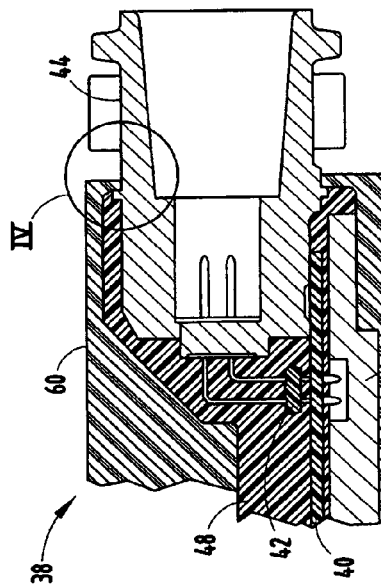

OVERMOLDED ELECTRONIC ASSEMBLY

TECHNICAL FIELD

The present invention relates to overmolded assemblies and more particularly to overmolded assemblies having a component that is partially overmolded and partially exposed.

BACKGROUND OF THE INVENTION

A method that has been successfully employed for insulating and/or protecting components susceptible to environmental damage, such as electrical components, is to overmold the component with either a thermoplastic or thermoset resin. In some cases, it is desirable to only partially overmold the component to protect a portion of the component while leaving another portion exposed. For example, in the case of plug and socket electrical component connectors that are mechanically and electrically connected to a printed circuit board, it is desirable to protect the circuit board in a housing, while leaving a portion of the electrical connector exposed for mating with a complementary connector. In such cases, it is desirable that the boundary or edge of the overmolding is well defined so that the overmolding does not cover any portion of the component that is designed to be exposed, yet completely covers those portions of the component that are intended to be overmolded.

Typically, overmolding involves shaping a flowable liquid or plastic resin under application of heat and pressure. In a known process shown in FIGS. 1 and 2, a plug type electrical component connector 10 is fabricated by first soldering or otherwise electrically and mechanically connecting a metal connector interface 12 to a printed circuit board 14, which may hold various electronic devices (e.g., flip chips, resistors, diodes, etc.) to form an assembly that is adhesively or otherwise secured to a backplate 16 (e.g., an aluminium backplate). The circuitry is protected by an overmolding 18 that together with backplate 16 form a housing. A portion of the connector interface 12 is covered by overmolding 18, while that portion of the connector interface that is mechanically coupled to a complementary connector is exposed.

It is desirable to have a sharply defined overmolding edge for providing an acceptable product appearance, and often for functional reasons as well. For example, in order to prevent mechanical interference during coupling of the connector 10 with its complementary connector, it is important that an edge 20 of overmolding 18 is precisely defined, i.e., that molding material (e.g., thermoplastic or thermosettable resin) does not flow past (or bleed-through) a shut-off 22 defined by abutting surfaces between an overmolding tool 24 and a component 12 that is to be partially overmolded.

In known processes, as depicted by FIGS. 1 and 2, it has often been necessary to carefully control the dimensions and tolerances of both the component 12 being partially overmolded and the overmolding tool 24 to provide nearly perfectly matched mating surfaces defining the shut-off 22, and/or to exert relatively high clamping forces on the overmolding tool 24 at the location of the abutting surfaces of the tool 24 and component 12. In some cases, this requires making the component stronger and more massive than might otherwise be required. Achieving a precisely defined overmolding edge may also place limits on the packing pressure (i.e., the internal pressure of the mold cavity defining surfaces of the overmolding tool), and/or the packing temperature (i.e., the temperature of the overmolding material in the mold cavity defined between the molding tool and the surface of the component that is being overmolded). This can place limitations on the types of overmolded materials that may be employed in a particular application.

SUMMARY OF THE INVENTION

The invention provides an improved component configuration and method of partially overmolding a component utilizing the improved configuration, which prevents bleed-through of overmolding material past a shut-off defined between abutting surfaces of a component that is to be partially overmolded and an overmolding tool, while allowing reduced clamping forces, greater flexibility in dimensional precision and tolerances of both the component that is to be partially overmolded and the overmolding tool, and facilitating the use of higher packing pressures and temperatures in the cavity defined between the component and the overmolding tool. The improved product configuration also provides increased strength and rigidity of the component at the location of the shut-off.

In an aspect of the invention, a partially overmolded component includes a component having a protruding elongate rib, and an overmolding attached to and partially covering the component and having an edge defined along the elongate rib.

In another aspect of the invention, a partially overmolded component is prepared by providing a component having a protruding elongate rib, providing an overmolding tool having adjacent intersecting surfaces that abut with adjacent intersecting surfaces of the component, including a surface of the elongate rib, injecting an overmolding material into a volume defined between the overmolding tool and the component that is to be overmolded, and solidifying the overmolding material.

These and other features, advantages and objects of the present invention will be further understood and appreciated by those skilled in the art by reference to the following specification, claims and appended drawings.

BRIEF DESCRIPTION OF THE DRAWINGS

The present invention will now be described, by way of example, with reference to the accompanying drawings, in which:

FIG. 1 is a cross-sectional view of a partially overmolded electronic assembly.

FIG. 2 is an enlarged view of a section II of the assembly shown in FIG. 1.

FIG. 3 is a cross-sectional view of a partially overmolded electronic assembly in accordance with the invention.

FIG. 4 is an enlarged view of a section IV of the assembly shown in FIG. 3.

DESCRIPTION OF THE PREFERRED EMBODIMENTS

In the illustrated embodiment (shown in FIGS. 3-4), an improved partially overmolded electronic assembly 38 in accordance with the invention comprises a substrate 40 (e.g., a printed circuit board) having an electronic device 42 (e.g., a flip-chip) mounted to the substrate, a component 44 (e.g., an electrical connector adapted for mating with a complementary connector), a base or backplate 46 on which substrate 40 and component 44 are mounted, and an overmolding 48 that together with backplate 46 constitute a housing for substrate 40 and electronic device 42. Overmolding 48 also is a partial overmolding for component 44, covering a portion of component 44 and leaving a portion of component 44 exposed. In particular, the connector interface (i.e., the portion of component 44 that interacts mechanically with a complementary connector) is not covered by overmolding 48.

The electronic assembly 38 shown in FIGS. 3-4 is typically prepared by soldering or otherwise attaching component 44 to substrate 40 to form a subassembly that can be adhesively bonded to backplate 46. Thereafter, an overmolding tool 60 is positioned over backplate 46, substrate 40 and component 44 to define a mold cavity that is filled with an overmolding material (typically a thermoplastic or thermosettable resin), and subsequently allowed to solidify (e.g., by cooling from a molten state to a solid state, and or by chemical cross-linking).

Unlike the known processes and assemblies in which the shut-off between an overmolding tool 24 (FIG. 2) and component 12 is defined along a single circumferential or semi-circumferential surface, the improved component design of the invention (FIG. 4) incorporates a protruding elongate or perimeter rib 52 having a surface 54 that intersects (approximately at a right angle) perimeter surface 56 of component 44 to provide adjacent intersecting contact surfaces between overmolding tool 60 and component 44, whereby bleed-through or loss of overmolding material through an adjacent shut-off 47 can be substantially reduced while also reducing the clamping force needed to hold overmolding tool 60 against component 44 during overmolding. Rib 52 also facilitates a relaxation of dimensional precision of both component 44 and overmolding tool 60, and enables overmolding processes to utilize higher packing pressures and/or higher temperatures without bleed-through. Protruding perimeter rib 52 increases the rigidity of component 44 at the edge of the overmolding to provide a method of preventing collapse and of successfully closing off the abutting surfaces to prevent bleed-through by increasing the strength of the component while only minimally increasing the weight of the component.

Reduced bleed-through or loss of overmolding material through the shut-off between the overmolding tool and the partially overmolded component is believed to be achieved due to an increased area of contact and/or a more tortuous flow path being provided between the overmolding tool and the partially overmolded component by the rib.

It will be understood by those who practice the invention and those skilled in the art that various modifications and improvements may be made to the invention without departing from the spirit of the disclosed concept. The scope of protection afforded is to be determined by the claims and by the breadth of interpretation allowed by law.

The invention claimed is:

1. An electrical component assembly comprising:
   a substrate for supporting electrical components;
   at least one electrical device carried on said substrate;
   at least one interface component carried on said substrate in-circuit with said electrical device, said interface component having an outer perimeter surface and an elongate rib protruding outwardly from said outer perimeter surface, said elongate rib defining an inwardly facing abutment surface and an outwardly facing abutment surface spaced from said inwardly facing abutment surface; and
   overmolding material partially encasing said interface component, said overmolding material defining an outwardly facing terminal edge adjacent said component perimeter surface abutting said inwardly facing abutment surface and exposing said outwardly facing abutment surface.

2. The electrical component assembly of claim 1, wherein said outer abutment surface is substantially planar and extends substantially normally from said outer perimeter surface.

3. The electrical component assembly of claim 1, wherein both said outer abutment surface and said outer perimeter surface comprise portions of an overmolding material shutoff in combination with an adjacent overmolding tool.

4. The assembly of claim 1, wherein the component is an electrical component.

5. The assembly of claim 1, wherein the component is an electrical connector.

6. The assembly of claim 1, wherein the substrate is a circuit board.

7. The assembly of claim 6, wherein the substrate is attached to a backplate, and wherein the backplate, component and overmolding together define a housing for the substrate.

* * * * *